(12) United States Patent
Lin

(10) Patent No.: US 8,228,079 B2
(45) Date of Patent: Jul. 24, 2012

(54) VOLTAGE DETECTING CIRCUIT AND VOLTAGE DETECTING METHOD

(75) Inventor: Chia-Hung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 699 days.

(21) Appl. No.: 12/242,844

(22) Filed: Sep. 30, 2008

(65) Prior Publication Data

US 2010/0033161 A1 Feb. 11, 2010

(30) Foreign Application Priority Data

Aug. 8, 2008 (TW) .............................. 97130391 A

(51) Int. Cl.
*G01R 27/08* (2006.01)
(52) U.S. Cl. ....................................... 324/713; 327/539
(58) Field of Classification Search .................. 324/713; 327/539
See application file for complete search history.

(56) References Cited

U.S. PATENT DOCUMENTS

| | | | |
|---|---|---|---|
| 6,614,295 B2 * | 9/2003 | Tsuchi ........................... | 327/563 |
| 6,630,859 B1 * | 10/2003 | Wang ............................ | 327/539 |
| 7,190,212 B2 * | 3/2007 | Shor et al. ..................... | 327/539 |
| 7,199,646 B1 * | 4/2007 | Zupcau et al. ................. | 327/539 |
| 7,268,528 B2 * | 9/2007 | Noda ............................. | 323/312 |
| 7,304,539 B2 * | 12/2007 | Tsurumaki et al. ........... | 330/285 |
| 7,535,212 B2 * | 5/2009 | Noda ............................ | 323/312 |
| 7,541,862 B2 * | 6/2009 | Fujisawa et al. .............. | 327/539 |
| 2004/0239413 A1 * | 12/2004 | Gubbins ........................ | 327/539 |
| 2005/0083129 A1 * | 4/2005 | Tsurumaki et al. .......... | 330/285 |
| 2007/0132506 A1 * | 6/2007 | Fujisawa et al. ............. | 327/539 |
| 2007/0200616 A1 * | 8/2007 | Shin ............................. | 327/539 |

* cited by examiner

*Primary Examiner* — Timothy J Dole
(74) *Attorney, Agent, or Firm* — Jianq Chyun IP Office

(57) ABSTRACT

Voltage detecting circuit for detecting a voltage state of a voltage source includes a first route, a second route and a comparator. First route is between a voltage source and a ground voltage, having a first current source and a first MOS resistor, connected in series at a first node with outputting a first voltage. Second route is between the voltage source and the ground voltage, having a second current source and a second MOS resistor, connected in series at a second node with outputting a second voltage. The comparator receives the first voltage and the second voltage and outputs the voltage state. The comparator includes a current offset circuit for producing an offset voltage to the second voltage. A voltage comparing unit compares the first voltage and the second voltage with offset by a voltage difference, and outputs the voltage state according to variance of the voltage difference.

14 Claims, 3 Drawing Sheets

VOLTAGE DETECTING CIRCUIT AND VOLTAGE DETECTING METHOD

CROSS-REFERENCE TO RELATED APPLICATION

This application claims the priority benefit of Taiwan application serial no. 97130391, filed Aug. 8, 2008. The entirety of the above-mentioned patent application is hereby incorporated by reference herein and made a part of this specification.

BACKGROUND OF THE INVENTION

1. Field of the Invention

The present invention generally relates to voltage detecting technology, in particular, to a voltage detecting circuit and a voltage detecting method at least capable of solving the problem of unstable detection caused by process difference.

2. Description of Related Art

A common integrated circuit uses a voltage source, for example, a VDD. However, during the operation of the circuit, the voltage source will be turned on and off frequently, so for some circuits, the voltage state of the voltage source must be detected accurately.

Conventional voltage detecting circuits have various designs. A complex circuit design uses a band-gap circuit. However, the detected voltage will have severe shift with the change of processes when the band-gap circuit is not used.

FIG. 1 is a schematic view of a conventional voltage detecting circuit without a band-gap circuit. Referring to FIG. 1, the voltage detecting circuit includes a current source 100 connected to a voltage source VDD for providing a current $I_1$. The current $I_1$ flows through a MOS transistor (M1) 102. The MOS transistor (M1) 102 serves as a resistor. The current $I_1$ produces a voltage VA at a node A. Further, a PMOS transistor (M3) 104 and an NMOS transistor (M2) 106 form an inverter with two gates connected to the node A. Formula (1) represents the trigger voltage mechanism of the inverter:

$$V_{SW} = \frac{VDD - V_{th,M3} + V_{th,M2} \times \sqrt{\frac{\beta_{M2}}{\beta_{M3}}}}{1 + \sqrt{\frac{\beta_{M2}}{\beta_{M3}}}} \quad (1)$$

in which β are characteristic parameters of common MOS transistors.

FIG. 2 is a schematic view of a waveform of an operation voltage signal of the voltage detecting circuit in FIG. 1. Referring to FIG. 2 together, a voltage signal 108 is a voltage at an output end (OUT), a voltage signal 110 is a voltage VA at the node A, and a voltage signal 112 is the variance of the voltage source VDD. During the increase of the VDD, the early stage 114 does not need to be considered. At the next stage 116, when the voltage VA starts to increase and is greater than a trigger voltage 118 of the inverter formed by the transistors 104 and 106, the output voltage OUT will transit. The decrease of the voltage VDD has the same principle.

The conventional circuit has a disadvantage that the trigger voltage will vary with the critical voltage Vth and the characteristic parameter β of the semiconductor devices. The critical voltage Vth and the characteristic parameter β may be different due to different processes, thus causing variances in the detection results.

Therefore, the voltage detecting circuit still needs to be further improved.

SUMMARY OF THE INVENTION

Accordingly, the present invention is directed to a voltage detecting circuit and a voltage detecting method, which do not use a band-gap circuit, and improve the tolerance to processes in voltage detection.

The present invention provides a voltage detecting circuit for detecting a voltage state of a voltage source, including a first route, a second route, and a comparator. The first route is between the voltage source and a ground voltage, includes a first current source and a first MOS resistor, and is connected in series at a first node for outputting a first voltage. The second route is between the voltage source and the ground voltage, includes a second current source and a second MOS resistor, and is connected in series at a second node for outputting a second voltage. The comparator receives the first voltage and the second voltage and outputs the voltage state. The comparator includes an offset circuit for producing an offset voltage to the second voltage and a voltage comparing unit for comparing the first voltage and the second voltage with offset, and outputs the voltage state according to variance of a voltage difference.

In the voltage detecting circuit according to an embodiment of the present invention, the voltage comparing unit has, for example, a positive input end and a negative input end, the first voltage is input to the positive input end, and the second voltage is connected to the negative input end through the offset circuit.

In the voltage detecting circuit according to an embodiment of the present invention, the first MOS resistor of the first route is, for example, an NMOS transistor, and a gate is connected to the first node.

In the voltage detecting circuit according to an embodiment of the present invention, the second MOS resistor of the second route is, for example, an NMOS transistor, and a gate is connected to the second node.

In the voltage detecting circuit according to an embodiment of the present invention, the comparator includes, for example, a first PMOS transistor, having a source, a drain, and a gate, in which the source is connected to the voltage source, and the drain is connected to the gate; a first NMOS transistor, having a source, a drain, and a gate, in which the gate receives the first voltage, and the drain is connected to the drain of the first PMOS transistor; a third current source, having a first end connected to the first NMOS transistor and a second end connected to the ground voltage; a second PMOS transistor, having a source, a drain, and a gate, in which the source is connected to the voltage source, the gate is connected to the gate of the first PMOS transistor, and the drain is connected to an output end; and a second NMOS transistor, having a source, a drain, and a gate, in which the gate receives the second voltage, the drain is connected to the output end, and the source is connected to the third current source. The offset voltage is produced by the first NMOS transistor and the second NMOS transistor.

In the voltage detecting circuit according to an embodiment of the present invention, for example, when a variance of a difference between the first voltage and the second voltage over time exceeds the offset voltage, the output voltage state transits.

The present invention further provides a voltage detecting method for detecting a voltage state of a voltage source. The method includes: outputting a first voltage between the voltage source and a ground voltage through a first route, in which the first route uses a first current source and a first MOS resistor and is connected in series at a first node for outputting the first voltage; outputting a second voltage between the voltage source and the ground voltage through a second route, in which the second route uses a second current source and a second MOS resistor and is connected in series at a second node for outputting the second voltage; applying an offset voltage to the second voltage; and comparing the first voltage with the second voltage with the offset, and outputting the voltage state according to a voltage difference.

In the voltage detecting method according to an embodiment of the present invention, for example, comparing the first voltage with the second voltage with the offset is to subtract the second voltage with offset from the first voltage.

In the voltage detecting method according to an embodiment of the present invention, for example, an NMOS transistor is used as the first MOS resistor of the first route, and a gate is connected to the first node.

In the voltage detecting method according to an embodiment of the present invention, for example, an NMOS transistor is used as the second MOS resistor of the second route, and a gate is connected to the second node.

In the voltage detecting method according to an embodiment of the present invention, for example, a comparator applies the offset voltage to the second voltage and compares the first voltage with the second voltage with offset, and using the comparator includes:

using a first PMOS transistor having a source, a drain, and a gate, in which the source is connected to the voltage source, and the drain is connected to the gate;

using a first NMOS transistor having a source, a drain, and a gate, in which the gate receives the first voltage, and the drain is connected to the drain of the first PMOS transistor;

using a third current source having a first end connected to the first NMOS transistor and a second end connected to the ground voltage;

using a second PMOS transistor having a source, a drain, and a gate, in which the source is connected to the voltage source, the gate is connected to the gate of the first PMOS transistor, and the drain is connected to an output end; and using a second NMOS transistor, having a source, a drain, and a gate, in which the gate receives the second voltage, the drain is connected to the output end, and the source is connected to the third current source. The offset voltage is produced by the first NMOS transistor and the second NMOS transistor.

In the voltage detecting method according to an embodiment of the present invention, for example, when a variance of a difference between the first voltage and the second voltage over time exceeds the offset voltage, the voltage state transits.

The present invention further provides a voltage detecting method for detecting a voltage state of a voltage source. The method includes: outputting a first voltage between the voltage source and a ground voltage through a first route, in which the first route uses a first current source and a first MOS resistor and is connected in series at a first node for outputting the first voltage; outputting a second voltage between the voltage source and the ground voltage through a second route, in which the second route uses a second current source and a second MOS resistor and is connected in series at a second node for outputting the second voltage; and when raising or decreasing the voltage, comparing a voltage difference varying over time between the first voltage and the second voltage, when the variance of the voltage difference exceeds a critical value, the voltage state transiting.

In the voltage detecting method according to an embodiment of the present invention, for example, the circuit structures of the first route and the second route are the same, and difference of manufacturing process between the MOS elements included in the routes produces the difference between the first voltage and the second voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
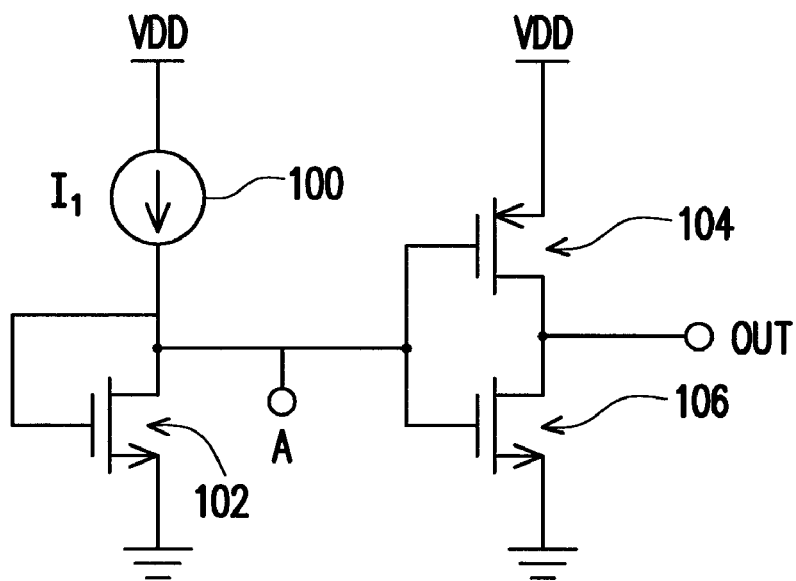
FIG. 1 is a schematic view of a conventional voltage detecting circuit without a band-gap circuit.
Figure 2:
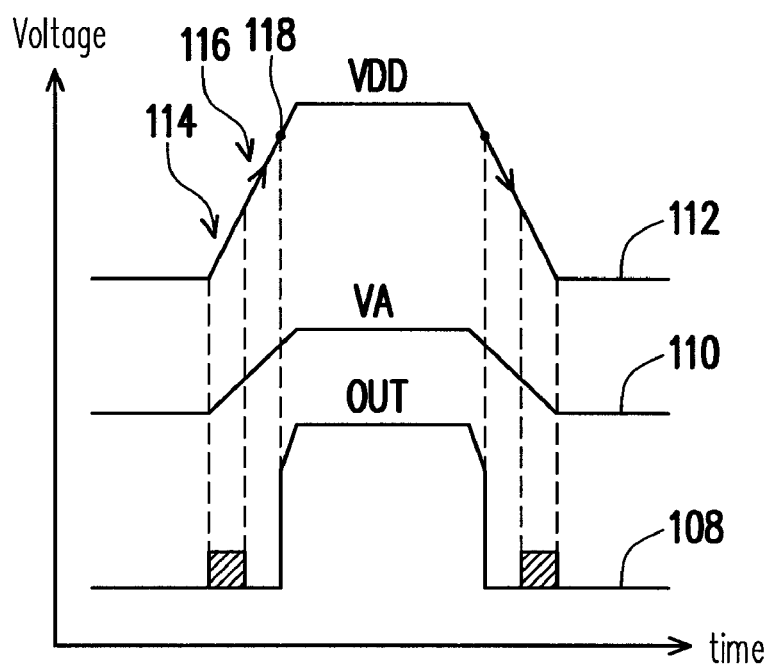
FIG. 2 is a schematic view of the waveform of an operation voltage signal of the voltage detecting circuit in FIG. 1.

Reference will now be made in detail to the present embodiments of the invention, examples of which are illustrated in the accompanying drawings. Wherever possible, the same reference numbers are used in the drawings and the description to refer to the same or like parts.

The voltage detecting circuit and the voltage detecting method of the present invention at least can improve the tolerance to processes in voltage detection without using a band-gap circuit. The present invention is illustrated below with the following embodiments, but is not limited to the embodiments.

Figure 3:
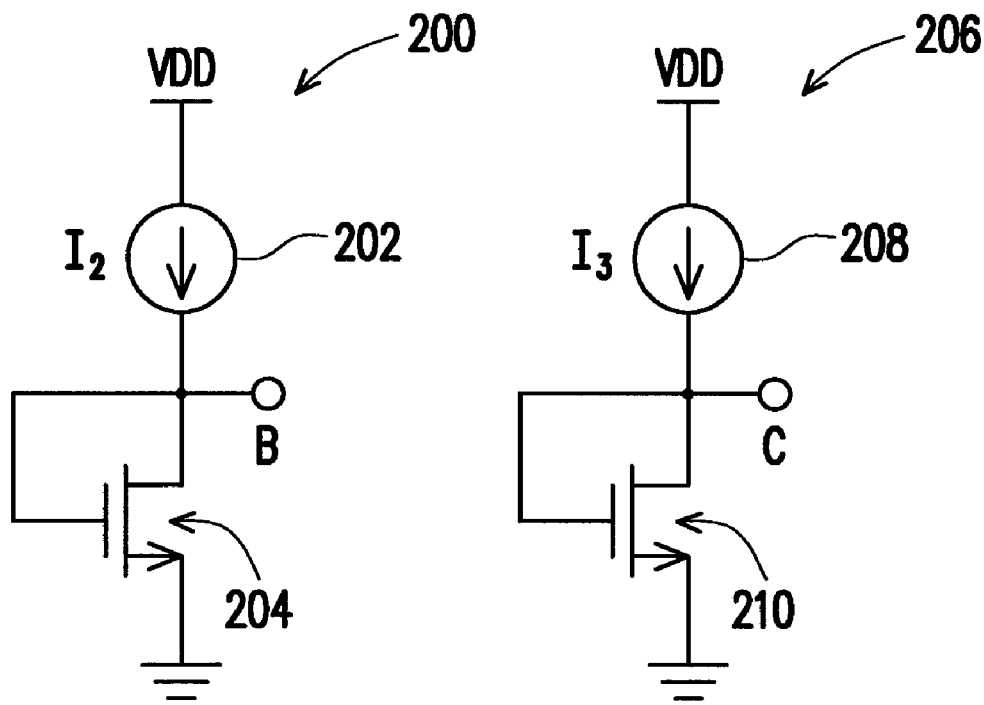
FIG. 3 is a schematic circuit diagram of producing a detection voltage by using a variance of difference between two voltages at a front end of a voltage detecting circuit according to an embodiment of the present invention.

FIG. 3 is a schematic circuit diagram of producing a detection voltage by using variance of difference between two voltages at a front end of a voltage detecting circuit according to an embodiment of the present invention. Referring to FIG. 3, two circuit routes 200, 206 of the present invention produce a voltage respectively for analysis, thus solving the problem of unstable detection caused by the difference of MOS elements. The circuit route 200 has a current source 202 connected to a voltage source for generating a current $I_2$. Similarly, the circuit route 206 has a current source 208 connected to the voltage source for generating a current $I_3$. The currents $I_2$ and $I_3$ flow through MOS transistors 204 and 210. A voltage VB, i.e., bias $V_{GS4}$ of the transistors, is generated at a node B of the circuit route 200. A voltage VC, i.e., bias $V_{GS5}$ of the transistors, is generated at a node C of the circuit route 206. The voltage VB ($V_{GS4}$) and voltage VC ($V_{GS5}$) at least have the difference caused by the process difference.

Figure 4:
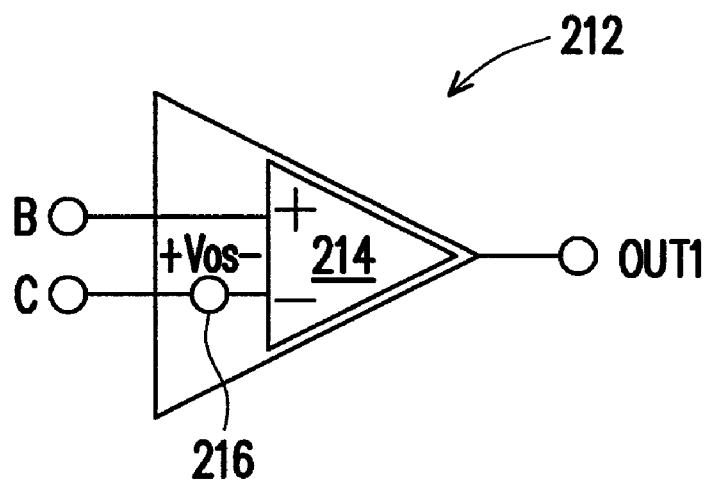
FIG. 4 is a schematic circuit diagram of a comparator at a rear end of a voltage detecting circuit according to an embodiment of the present invention.

FIG. 4 is a schematic circuit diagram of a comparator at a rear end of a voltage detecting circuit according to an embodiment of the present invention. Referring to FIG. 4, in addition to a voltage comparing unit 214, a comparator 212 of the present invention includes an offset circuit 216 disposed at one of the input ends of the voltage comparing unit 214, for producing an offset voltage Vos. In this embodiment, for example, the offset circuit is disposed at a negative input end of the voltage comparing unit 214. A positive input end of the voltage comparing unit 214 receives, for example, the voltage VB of the node B of the circuit route 200. The input end of the offset circuit 216 receives the voltage VC of the node C of the circuit route 206.

Figure 5:
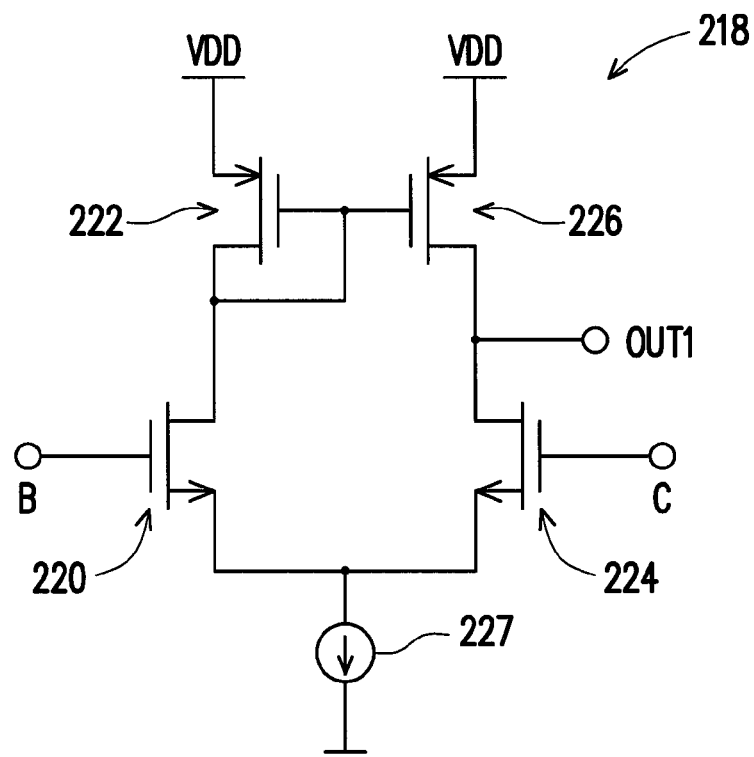
FIG. 5 is schematic structural view of a circuit of a comparator according to an embodiment of the present invention.

FIG. 5 is schematic structural view of a circuit of a comparator according to an embodiment of the present invention. Referring to FIG. 5, a comparator integrated circuit 218 integrating the voltage comparing unit 214 and the offset circuit 216 includes, for example, two PMOS transistors 222, 226, two NMOS transistors 220, 224, and a current source 227. The comparator integrated circuit 218 has an output end OUT1. The PMOS transistor 222 has a source, a drain, and a gate, in which the source is connected to a voltage source VDD, and the drain and the gate are connected together. The NMOS transistor 220 has a source, a drain, and a gate, in which the gate receives the voltage VB, and the drain is connected to the drain of the PMOS transistor 222. The current source 227 has an end connected to the NMOS transistor 220 and the other end connected to a ground voltage. The PMOS transistor 226 has a source, a drain, and a gate, in which the source is connected to the voltage source VDD, the gate is connected to the gate of the PMOS transistor 226, and the drain is connected to the output end OUT1. The NMOS transistor 224 has a source, a drain, and a gate, in which the gate receives the voltage VC, the drain is connected to the output end OUT1, and the source is connected to the current source 227. The circuit 218 produces the offset voltage by the NMOS transistor 220 and the NMOS transistor 224.

The input ends of the comparator 212 (FIG. 4) with the offset circuit 216 are connected to the voltage VB of the node B and voltage VC of the node C. For the convenience of illustration, it is assumed that the current sources 202 and 208 in FIG. 3 are the same current source, the generated current $I_2$ and $I_3$ are equal, and the current value increases (decreases) with the increase (decrease) of VDD. Therefore, the difference between VB and VC also increases (decreases) with the increase (decrease) of VDD. The difference can be represented by formula (2):

$$VB - VC = \Delta Vov1 \qquad (2)$$

$$= \sqrt{2I_2}\left(\sqrt{\frac{1}{\beta_{204}}} - \sqrt{\frac{1}{\beta_{210}}}\right),$$

in which β is characteristic parameters of transistors 204, 210 in FIG. 3, and $\Delta V_{ov1}$ is the difference between voltages VB and VC.

Figure 6:
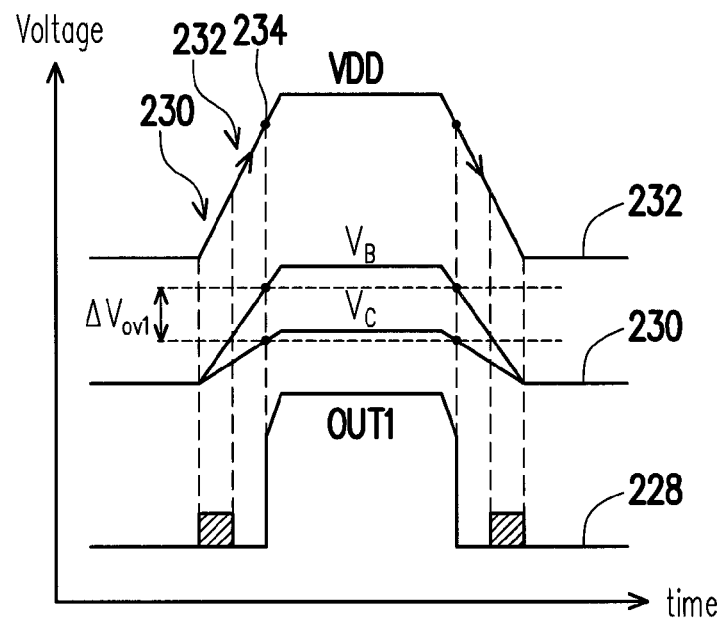
FIG. 6 is a schematic view of the waveform of an operation voltage signal of a voltage detecting circuit according to an embodiment of the present invention.

FIG. 6 is a schematic view of the waveform of an operation voltage signal of a voltage detecting circuit according to an embodiment of the present invention. Referring to FIG. 5 together, a voltage signal 228 is a voltage of the output end OUT1, a voltage signal 230 is a voltage VB of the node B and voltage VC of the node C, and a voltage signal 232 is a voltage variance of the voltage source VDD. During the increase of VDD, when the difference $\Delta V_{ov1}$ between VB and VC is increased, the difference $\Delta V_{ov1}$ does not need to be considered at the early stage. At the next stage, when the difference $\Delta V_{ov1}$ is greater than the offset voltage (Vos) of the comparator 212, the output voltage OUT1 will transit. The decrease of VDD has the same principle, when the difference $\Delta V_{ov1}$ between VB and VC is decreased and is greater than the offset voltage (Vos) of the comparator 212, the output voltage OUT1 will transit. Taking the circuit in FIG. 5 as an example, if the current $I_4$ of the current source 227 is equal to $I_2$, the offset voltage Vos can be represented by formula (3):

$$Vos = \sqrt{2I_2}\left(\sqrt{\frac{1}{\beta_{220}}} - \sqrt{\frac{1}{\beta_{224}}}\right). \qquad (3)$$

When the current $I_2$ varies with the process, $\Delta V_{ov1}$ and Vos will be increased or decreased together, thus the circuit of the present invention at least can overcome the disadvantages of the conventional circuit, and a trigger voltage 234 will not vary with the process easily.

On the contrary, during the decrease of VDD, when $\Delta V_{ov1}$ is decreased and exceeds the offset voltage Vos, the output voltage signal 228 will transit.

In other words, the present invention produces two voltages through two circuit routes, and detects the variance of the difference between the two voltages to stably know whether VDD is decreased or increased.

The present invention also provides a voltage detecting method for detecting a voltage state of a voltage source. The method includes: outputting a first voltage between the voltage source and a ground voltage through a first route, in which the first route uses a first current source and a first MOS resistor and is connected in series at a first node for outputting the first voltage; outputting a second voltage between the voltage source and the ground voltage through a second route, in which the second route uses a second current source and a second MOS resistor and is connected in series at a second node for outputting the second voltage; applying an offset voltage to the second voltage; and comparing the first voltage and the second voltage with the offset, and outputting the voltage state according to a voltage difference.

The method of the present invention can further be a more general voltage detecting method for detecting a voltage state of a voltage source. The method includes: outputting a first voltage between the voltage source and a ground voltage through a first route, in which the first route uses a first current source and a first MOS resistor and is connected in series at a first node for outputting the first voltage; outputting a second voltage between the voltage source and the ground voltage through a second route, in which the second route uses a second current source and a second MOS resistor and is connected in series at a second node for outputting the second voltage; when raising or decreasing the voltage, comparing the first voltage and the second voltage to obtain a voltage difference varying over time, when the variance of the voltage difference exceeds a critical value, the voltage state transiting.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage detecting circuit, for detecting a voltage state of a voltage source, comprising:
    a first route, between the voltage source and a ground voltage, comprising a first current source and a first MOS resistor, and connected in series at a first node for outputting a first voltage;

a second route, between the voltage source and the ground voltage, comprising a second current source and a second MOS resistor, and connected in series at a second node for outputting a second voltage; and a comparator, for receiving the first voltage and the second voltage and outputting the voltage state, comprising:

an offset circuit, for producing an offset voltage to the second voltage; and a voltage comparing unit, for comparing the first voltage and the second voltage with offset, and outputting the voltage state according to variance of a voltage difference, wherein the first route and the second route are identical in a circuit structure and device structures of the circuit structure, in that the first current source and the second current source are a same current source.

2. The voltage detecting circuit according to claim 1, wherein the voltage comparing unit has a positive input end and a negative input end, the first voltage is input to the positive input end, and the second voltage is connected to the negative input end through the offset circuit.

3. The voltage detecting circuit according to claim 1, wherein the first MOS resistor of the first route is an NMOS transistor, and a gate of the NMOS transistor is connected to the first node.

4. The voltage detecting circuit according to claim 1, wherein the second MOS resistor of the second route is an NMOS transistor, and a gate of the NMOS transistor is connected to the second node.

5. The voltage detecting circuit according to claim 1, wherein the comparator comprises:

a first PMOS transistor, having a source, a drain, and a gate, wherein the source is connected to the voltage source, and the drain is connected to the gate;

a first NMOS transistor, having a source, a drain, and a gate, wherein the gate receives the first voltage, and the drain is connected to the drain of the first PMOS transistor;

a third current source, having a first end connected to the first NMOS transistor and a second end connected to the ground voltage;

a second PMOS transistor, having a source, a drain, and a gate, wherein the source is connected to the voltage source, the gate is connected to the gate of the first PMOS transistor, and the drain is connected to an output end; and a second NMOS transistor, having a source, a drain, and a gate, wherein the gate receives the second voltage, the drain is connected to the output end, and the source is connected to the third current source, wherein the offset voltage is produced by the first NMOS transistor and the second NMOS transistor.

6. The voltage detecting circuit according to claim 1, wherein when a variance of a difference between the first voltage and the second voltage over time exceeds the offset voltage, the output voltage state transits.

7. A voltage detecting method, for detecting a voltage state of a voltage source, comprising:

outputting a first voltage between the voltage source and a ground voltage through a first route, wherein the first route uses a first current source and a first MOS resistor and is connected in series at a first node for outputting the first voltage;

outputting a second voltage between the voltage source and the ground voltage through a second route, wherein the second route uses a second current source and a second MOS resistor and is connected in series at a second node for outputting the second voltage;

applying an offset voltage to the second voltage; and comparing the first voltage and the second voltage with the offset, and outputting the voltage state according to a voltage difference, wherein the first route and the second route are identical in a circuit structure and device structures of the circuit structure, in that currents respectively from the first current source and the second current source are equal.

8. The voltage detecting method according to claim 7, wherein comparing the first voltage and the second voltage with offset is to subtract the second voltage with offset from the first voltage.

9. The voltage detecting method according to claim 7, wherein an NMOS transistor is used as the first MOS resistor of the first route, and a gate of the NMOS transistor is connected to the first node.

10. The voltage detecting method according to claim 7, wherein an NMOS transistor is used as the second MOS resistor of the second route, and a gate of the NMOS transistor is connected to the second node.

11. The voltage detecting method according to claim 7, wherein a comparator applies the offset voltage to the second voltage and compares the first voltage and the second voltage with offset, and using the comparator comprises:

using a first PMOS transistor having a source, a drain, and a gate, wherein the source is connected to the voltage source, and the drain is connected to the gate;

using a first NMOS transistor having a source, a drain, and a gate, wherein the gate receives the first voltage, and the drain is connected to the drain of the first PMOS transistor;

using a third current source having a first end connected to the first NMOS transistor and a second end connected to the ground voltage;

using a second PMOS transistor having a source, a drain, and a gate, wherein the source is connected to the voltage source, the gate is connected to the gate of the first PMOS transistor, and the drain is connected to an output end; and using a second NMOS transistor having a source, a drain, and a gate, wherein the gate receives the second voltage, the drain is connected to the output end, and the source is connected to the third current source, wherein the offset voltage is produced by the first NMOS transistor and the second NMOS transistor.

12. The voltage detecting method according to claim 7, wherein when a variance of a difference between the first voltage and the second voltage over time exceeds the offset voltage, the voltage state transits.

13. A voltage detecting method, for detecting a voltage state of a voltage source, comprising:

outputting a first voltage between the voltage source and a ground voltage through a first route, wherein the first route uses a first current source and a first MOS resistor and is connected in series at a first node for outputting the first voltage;

outputting a second voltage between the voltage source and the ground voltage through a second route, wherein the second route uses a second current source and a second MOS resistor and is connected in series at a second node for outputting the second voltage; and when raising or decreasing the voltage, comparing a voltage difference varying over time between the first voltage and the second voltage, wherein when the variance of the voltage difference exceeds a critical value, the voltage state transits,
wherein the first route and the second route are identical in a circuit structure and device structures of the circuit structure, in that currents respectively from the first current source and the second current source are equal.

14. The voltage detecting method according to claim 13, wherein a difference in manufacturing processes between the MOS elements in the routes produces the difference between the first voltage and the second voltage.

* * * * *